(12) United States Patent
Yang et al.

(10) Patent No.: US 6,916,685 B2
(45) Date of Patent: Jul. 12, 2005

(54) METHOD OF PLATING METAL LAYER OVER ISOLATED PADS ON SEMICONDUCTOR PACKAGE SUBSTRATE

(75) Inventors: Wei-Sheng Yang, Hsin-Chu (TW); Chih-Liang Chu, Hsin-Chu (TW); Kuo-Sheng Wei, Hsin-Chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 78 days.

(21) Appl. No.: 10/686,435

(22) Filed: Oct. 14, 2003

(65) Prior Publication Data

US 2004/0209395 A1 Oct. 21, 2004

(30) Foreign Application Priority Data

Apr. 18, 2003 (TW) ........................................ 92109029 A

(51) Int. Cl.[7] .............................................. H01L 21/44
(52) U.S. Cl. ...................................... 438/108; 438/106
(58) Field of Search ................................. 438/106–107, 438/617, 637–638, 700, 678

(56) References Cited

U.S. PATENT DOCUMENTS

2004/0021156 A1 * 2/2004 Asano et al. ............... 257/222

* cited by examiner

*Primary Examiner*—Dung A. Le
(74) *Attorney, Agent, or Firm*—Fulbright & Jaworski LLP

(57) ABSTRACT

A method of plating a metal layer over isolated pads on a semiconductor package substrate is proposed. This substrate is formed with a plurality of conductive blind vias. The isolated pads are formed on a surface of the substrate, each having a plating line extending towards one blind via but electrically insulated from the blind via by an electrically insulating region. A conductive film covers the surface of the substrate having the isolated pads, and a photoresist layer is formed over the conductive film. The photoresist layer has openings for exposing a portion of the conductive film covering the isolated pads. The exposed portion of the conductive film is removed, to allow a metal layer to be plated on the isolated pads. Then, the photoresist layer and the remainder of the conductive film are removed, and the electrical insulation between the isolated pads and the blind vias is restored.

9 Claims, 11 Drawing Sheets

METHOD OF PLATING METAL LAYER OVER ISOLATED PADS ON SEMICONDUCTOR PACKAGE SUBSTRATE

FIELD OF THE INVENTION

The present invention relates to a method of plating a metal layer over isolated pads within a ring array area on a semiconductor package substrate, particularly applied in a ball grid array (BGA) substrate with a high density of circuit layout of isolated pads placed thereon.

BACKGROUND OF THE INVENTION

Generally, conductive traces made of metals such as copper are formed on the surface of a conventional semiconductor package substrate. Connecting pads extend from the conductive traces for providing a signal transmission means. Typically, in order to electrically connect conductive elements such as gold wires, solder bumps, or solder balls to a chip or a printed circuit board (PCB), the exposed surface of the electrical connecting pads must be plated with a metal layer such as a Nickel/Gold (Ni/Au) or Nickel/Silver (Ni/Ag) layer. Conventional electrical connecting pads include bump pads for providing electrical connection between a flip-chip package substrate and the chip, presolder pads, and fingers for a wire bonding package to electrically connect the chip, or ball pads for providing electrical connection between the substrate and other PCBs. In addition, with the provision of a Ni/Au metal layer formed on the electrical connecting pads, it is possible to prevent oxidation of the connecting pads as well as to improve the solder joint reliability between conductive elements and the electrical connecting pads.

There are several conventional methods for plating such as the chemical method, electroplating, sputtering, and plasma deposition. However the chemical method has the drawback of low bonding reliability resulting from skip plating or black pads, and sputtering or plasma deposition are both costly. Thus, the most common method of forming the metal layer is either electroplating or the electroless plating method.

As shown in FIG. 8, plating a Ni/Au metal layer on a semiconductor package substrate is typically achieved by forming several electrical connecting pads 24 on a semi-completed substrate 2 in which upper and lower conductive trace layers 21, 22 and several through holes 23 are formed via development and etching processes. Further, the outer surface of the substrate 2 is covered by a solder mask 25.

In order to plate a Ni/Au metal layer on the electrical connecting pad 24, it is necessary to dispose a plurality of plating lines 27 on the conductive traces to supply electric current for electroplating the Ni/Au layer 26 on the electrical connecting pad 24. As such, the substrate surface is largely occupied by the plating lines, and, moreover, the plating lines may result in radiating electromagnetic noise when the package operates at high frequency. Although noise can be reduced by using an etchback method to sever the connections for the plating lines 27, the terminal parts of the plating lines still exist in the form of an undesirable maze with a large number of disconnected terminals. Thus, the problem of insufficient circuit layout area and noise still remains.

In order to solve the above-mentioned electroplating problem, a common gold pattern plating (GPP) has been proposed. As shown in FIG. 9A, the manufacturing process starts with the formation of a conductive layer 31 on both the top and bottom surfaces of the substrate 3 which are electrically connected to each other via the provision of a plurality of plating through holes (PTH) or blind vias (both not shown).

Following that, as shown in FIG. 9B, the conductive layers 31 of the substrate are covered by photoresist layers 32 having openings to allow regions of the conductive layer 31 where the conductive circuits are formed later thereon to be exposed. And a Ni/Au layer 33 is formed on the uncovered regions of conductive layers 31 by electroplating via the conductive layer 31 which acts as a conductive path for electric current.

Further, as shown in FIG. 9C, the photoresist layer 32 is then removed, and then, by using etching technology, the conductive layer 31 under the Ni/Au metal layer 33 is patterned to form a patterned circuit 310 covered by the Ni/Au metal layer 33, as shown in FIG. 9D.

Gold pattern plating technology utilizes a conductive layer instead of plating lines to allow electric current to pass through; however, the overall cost of materials is very high as the entire circuit layer (including electrical connecting pads and all conductive circuits) is covered with the Ni/Au metal layer. Moreover, during the latter procedure of circuit patterning, because the circuit layer is entirely covered with the Ni/Au layer and the material property of the solder mask greatly differs from that of the Ni/Au metal, stable adhesion between the two is very difficult to achieve. Thus, in order to solve the above-mentioned problems, a non-plating line (NPL) technology has been proposed to form the Ni/Au metal layer on the electrical connecting pads.

The non-plating line (NPL) technology provides a method of forming an electroplated metal layer on the electrical connecting pad without the need of plating lines; however, it has some drawbacks when applied to a semiconductor package substrate with a high density of circuit layout and fine pitch. Referring to FIG. 10, because the pitch between any two electrical connecting pads 42 is reduced, it is common for the two openings 411 of the conductive films 41 from adjacent connecting pads to partly overlap. In the case of connecting pads being arranged in a ring array where the region on the substrate 4 is circularly surrounded by isolated pads, the partly overlapping openings 411 of the conductive films 41 will be connected with each other, which leads to open-circuit regions incapable of connecting with external electric current, and thus ultimately preventing electroplating of the isolated pads 42. Moreover, when NPL is applied in a substrate design with a high density of circuit layout and fine pitch, the periphery of the isolated pads will have insufficient area for disposing several plating lines outwardly onto the conductive film 41. Thus, even though plating lines could be disposed for providing electrical current, electroplating is still not possible on the isolated pads 42 in the open-circuit region if there is no room to dispose the plating lines.

Therefore, manufacturers are now trying to develop a method of manufacturing a semiconductor package substrate with an electroplated metal layer formed on isolated pads using a simplified manufacturing procedure with reduced cost that does not posses the reliability concerns of the conventional electroplating method and avoids the drawback that the electroplated metal layer cannot be formed on isolated pads within a ring array area.

SUMMARY OF THE INVENTION

A primary objective of the present invention is to provide method of plating a metal layer on the isolated pads that are formed in a ring array layout.

Another objective of the present invention is to provide an alternative method of plating a metal layer on isolated pads, allowing a larger surface around the periphery of the isolated pads to be used for circuit layout.

In order to achieve the foregoing objectives, the present invention provides a method of plating a metal layer on isolated pads that are formed in a ring array layout, comprising the following steps:

firstly, a semiconductor package substrate having a plurality of conductive blind vias for electrically connecting with inner layer circuits is provided with a plurality of isolated pads formed thereon, each of which has a plating line extending towards the conductive blind via and partially disconnecting to the conductive blind via, each terminal of the plating lines and the blind via can be separated by an electrical insulating region;

a conductive film is applied on the surface of the substrate, establishing electrical connection via this conductive film between the conductive blind vias and the tails extending from the isolated pads;

a photoresist layer having at least one opening is applied over the conductive film, wherein each opening allows the conductive film on the isolated pads to be exposed through the photoresist layer;

the conductive film exposed through each opening in the photoresist layer is partially removed, allowing the isolated pads to be electrically connected to the blind vias via the underlying conductive film;

the substrate is then electroplated to form a metal layer on the surfaces of the isolated pads;

both the photoresist layer and the underlying conductive film covered thereby are removed to restore electric insulation between the isolated pads and the blind vias and;

a solder mask is then applied to the surface of the substrate, for exposing each isolated pads to the openings of the solder mask layer and thus completing the manufacturing of a substrate with a plated metal layer formed on the isolated pads.

With the provision of the blind vias in the center of a ring array of isolated pads, it is feasible to plate a metal layer on the surfaces of the isolated pads. Moreover, since the electric current for plating flows from the center of this ring array, instead of from space-occupying features around the periphery, there is more surface area available for circuit features, and thus a higher overall circuit density.

DETAILED DESCRIPTION OF THE PREFERRED EMBODIMENTS

A method of plating a metal layer over isolated pads within a ring array area on a semiconductor package substrate, as proposed in the present invention, is fully described in the following embodiment with reference to FIGS. 1 to 7 which illustrate the manufacturing steps according to the same embodiment, wherein each Figure (except for FIG. 5) comprises a top view (A) and a cross-sectional view (B).

Figure 1A:
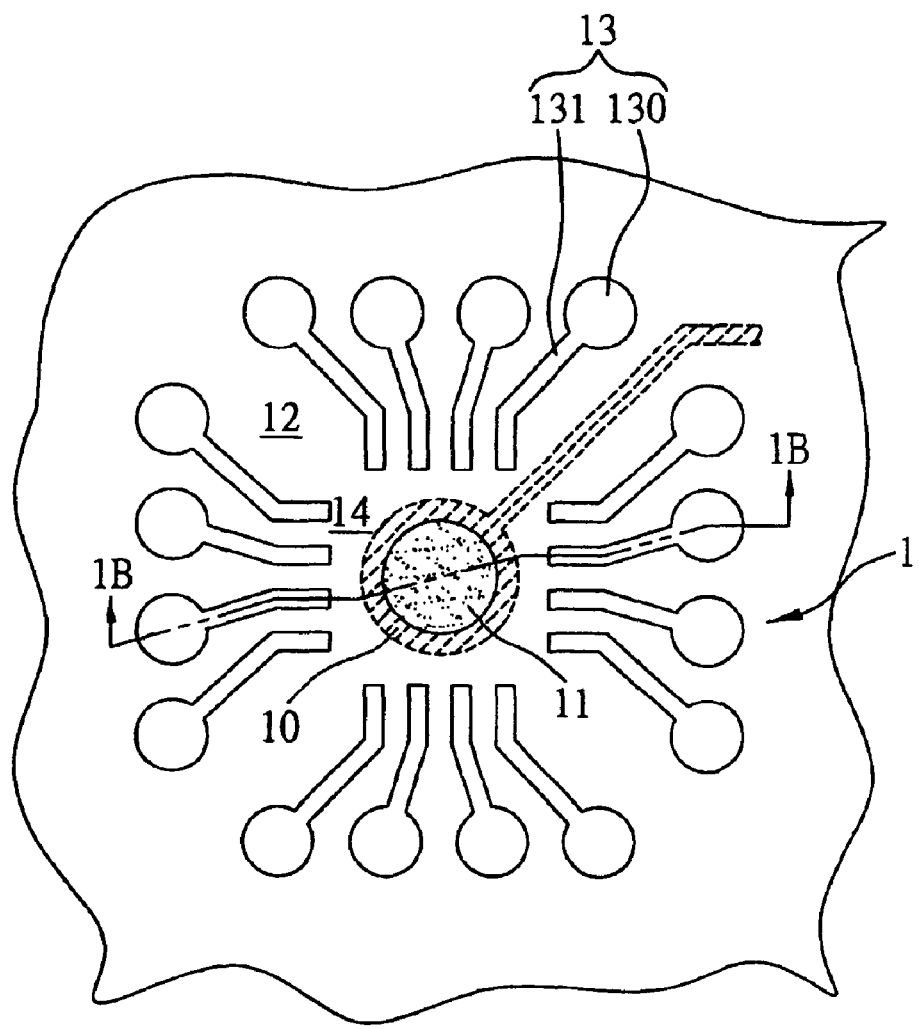
FIG. 1A is schematic a top-view showing a substrate having a conductive blind via surrounded by isolated pads within a ring array area, in accordance with the invention.
Figure 1B:
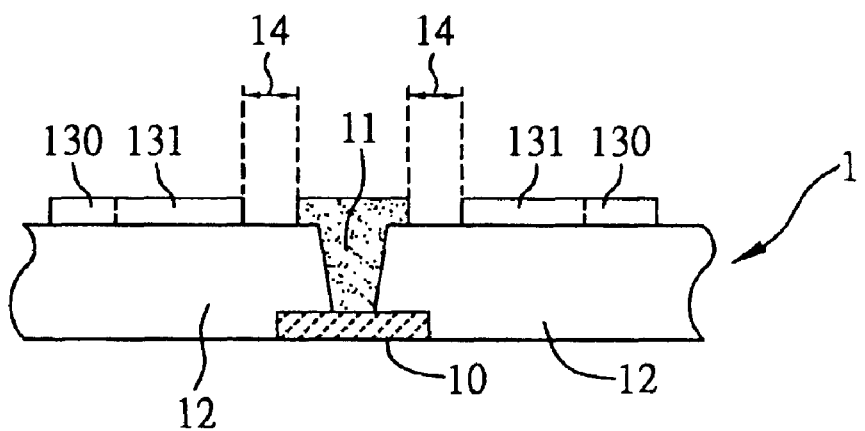
FIG. 1B is a schematic cross-sectional view showing the substrate having a conductive blind via surrounded by isolated pads within a ring array area, in accordance with the invention.

As shown in FIG. 1A and FIG. 1B, a semiconductor package substrate 1 is provided. The substrate 1 has a high density of connecting pads arranged in a ring array. The substrate 1 comprises an internal circuit 10, a conductive blind via 11 which axially extends through the dielectric layer 12 on the internal circuit 10 and is electrically connected with the internal circuit 10, and a plurality of isolated pads 13 formed on the dielectric layer 12 at the peripheral region of the conductive blind via 11 to form a ring array arrangement. Each of the isolated pads has an isolated pad body 130 extending toward the blind via 11 to form a plating line 131 which is not connected with the blind via 11, allowing an electrically insulating region 14 to be formed between the conductive blind via 11 and the terminal of the plating line 131. The dielectric layer 12 is selected from the group consisting of organic materials, fiber-reinforced materials, and particle-reinforced materials. For example, Epoxy resin, Bismaleimide Triazine, and Cyanate ester may be used with or without fiber or particle reinforcement. There are many techniques for forming conductive blind vias and circuits, which are commonly used by manufacturers, thus further description is omitted herein.

Figure 2A:
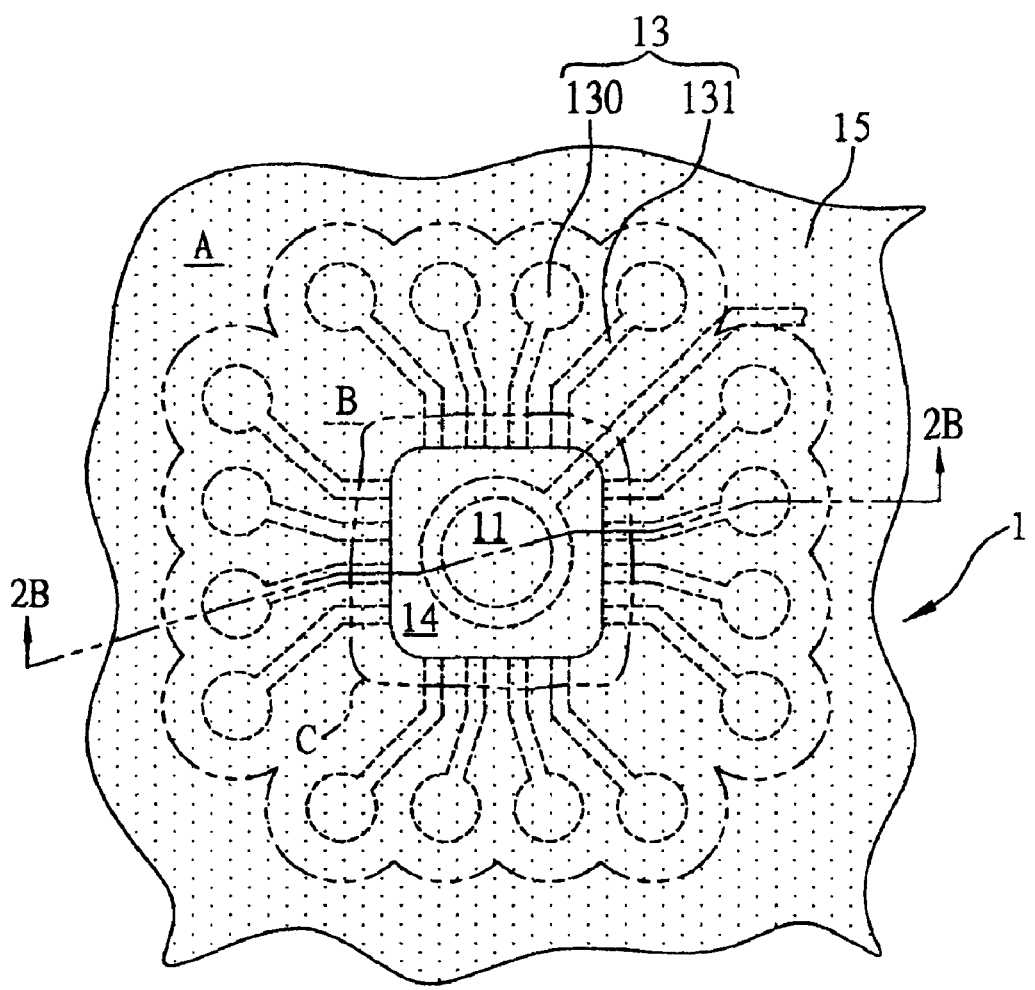
FIG. 2A is a schematic top-view showing the substrate at the stage after a conductive film is applied thereon, in accordance with the invention.
Figure 2B:
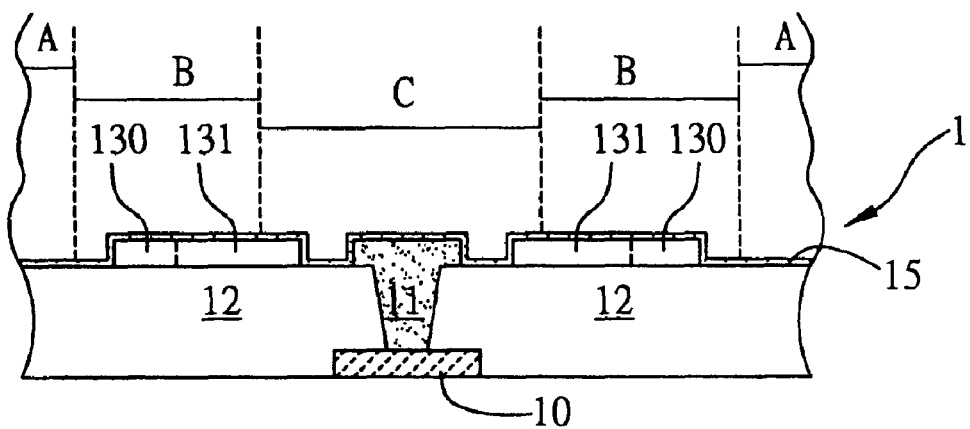
FIG. 2B is a schematic cross-sectional view showing the substrate at the stage after a conductive film has been applied thereon, in accordance with the invention.

Following that, as shown in FIG. 2A and FIG, 2B, a conductive film 15 is applied over the surface of the substrate 1 so as to allow electric current to flow during the plating process. The conductive film 15 may consist of Gold, alloys, and other conductive high-molecular materials, such as Copper, Tin, Nickel, Chromium, Titanium, Copper-Chromium alloy and Tin-Lead alloy, preferably made of Copper particles, or Palladium particles. The conductive film may be applied by using electroless plating, PVD, or CVD such as electroless plating, sputtering, evaporation deposition, arc vapor deposition, ion beam sputtering, laser ablation deposition, and plasma enhanced CVD. Referring to FIG. 2, the surface of the substrate 1 can be divided into a peripheral pad region indicated as "A" defined by the region not being in contact with the isolated pads 13, a pad plating region indicated as "B" defined by the region covering the main isolated pads and most of the length of plating lines, and a blind via plating region indicated as "C" defined by the region covering the conductive blind via 11, electrically insulating region 14 and the terminals the plating lines 131.

Figure 3A:
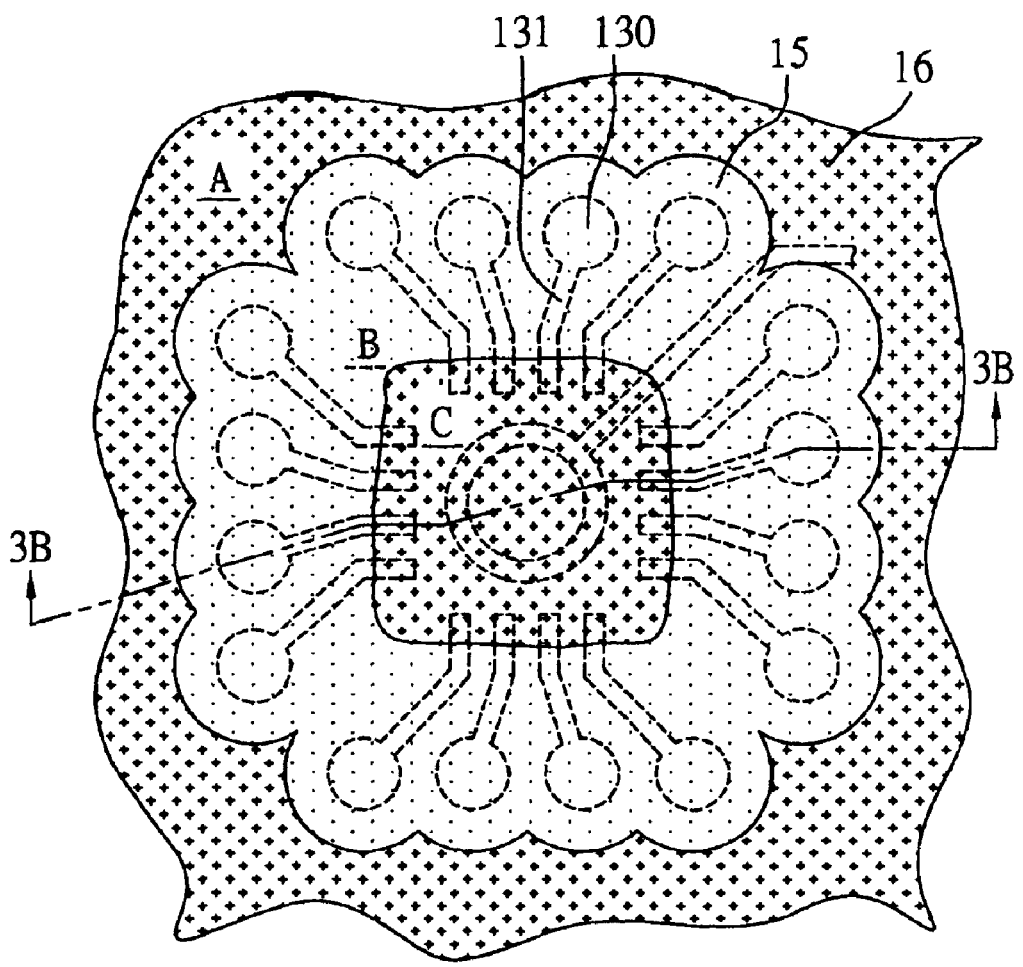
FIG. 3A is a schematic top-view showing the substrate at the stage after a photoresist layer has been applied over the conductive film, in accordance with the invention.
Figure 3B:
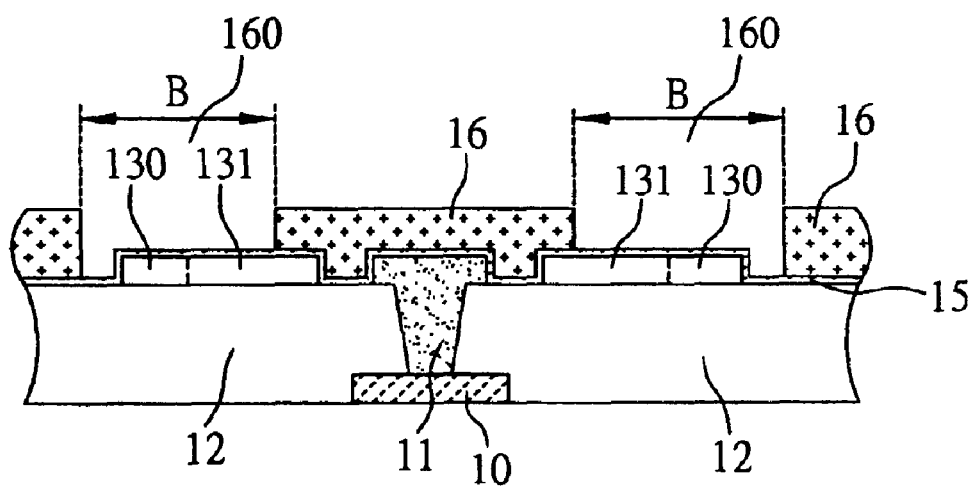
FIG. 3B is a schematic cross-sectional view showing the substrate at the stage when a photoresist layer is applied over the conductive film, in accordance with the invention.

Then, as shown in FIGS. 3A and 3B, a photoresist layer 16, which can be in a dry film or a liquid photoresist, is applied over the conductive film 15 of the substrate 1 using printing, spin coating, or lamination techniques. The photoresist layer 16 is formed with a plurality of openings with predetermined size to allow a part of the conductive film 15 to be exposed. Thus, as shown in FIG. 3A, both the peripheral pad region "A" and the blind via plating region "C" are covered by the photoresist layer 16, whereas the conductive film 15 in the pad plating region "B" is exposed.

Figure 4A:
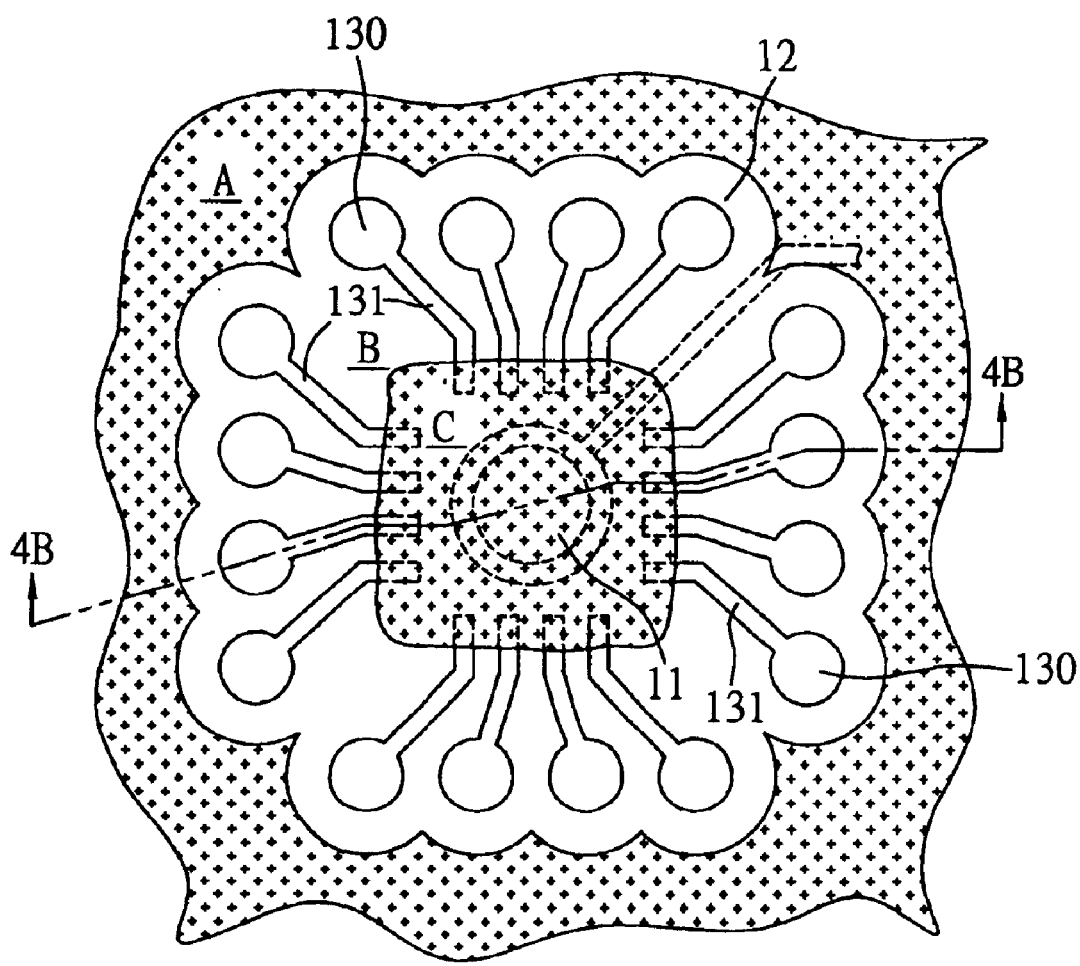
FIG. 4A is a schematic top-view showing the substrate at the stage after a conductive film on the isolated pads of the electroplating region has been removed, in accordance with the invention.
Figure 4B:
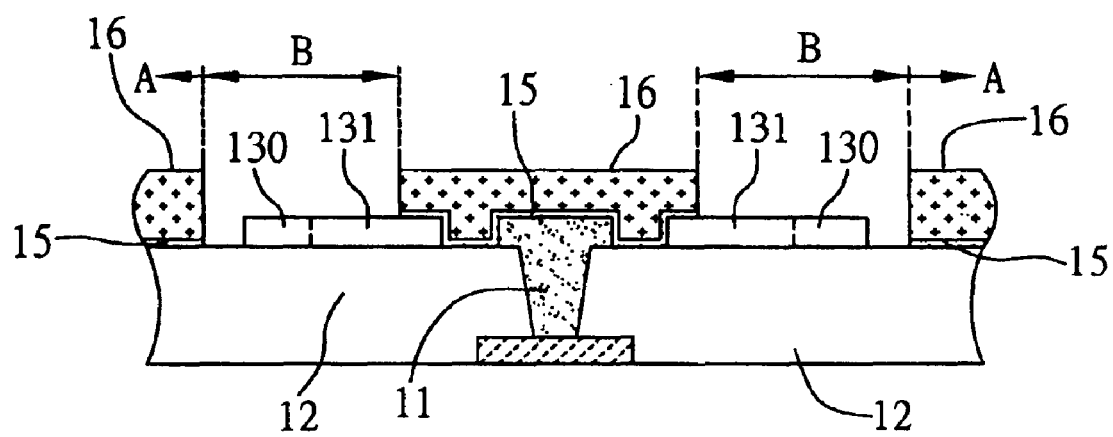
FIG. 4B is a schematic cross-sectional view showing the substrate at the stage after a conductive film on the isolated pads of the electroplating region has been removed, in accordance with the invention.

Following this, as shown in FIGS. 4A and 4B, the conductive film 15 of region "B" which is not covered by the photoresist layer 16 is removed using etching or laser treatment technology. Referring to FIG. 4B, after the conductive film 15 in the pad plating region "B" is removed, the isolated pad bodies 130 and most of the length of the plating lines 131 are exposed again. Thus, the conductive blind via 11, remaining conductive film 15, plating lines 131 and the isolated pad bodies 130 are all electrically connected, while electrical insulation between the peripheral pad region "A" and the isolated pad bodies 130 has been restored.

Figure 5:
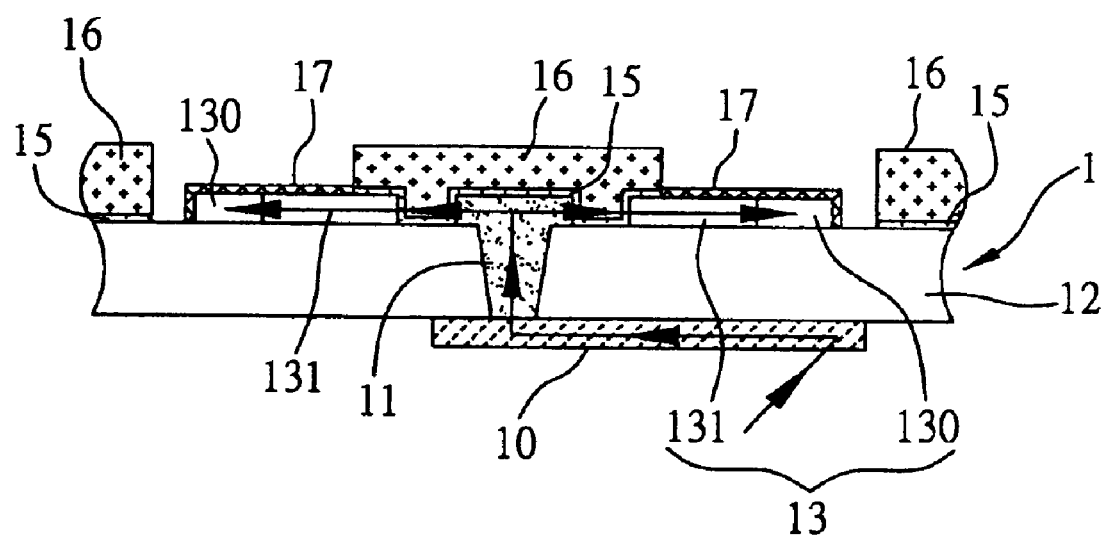
FIG. 5 a schematic cross-sectional view showing the substrate with the formation of a metal layer by electroplating, in accordance with the invention.

Then, as shown in FIG. 5, by using an electroplating method, the substrate 1 is plated with a metal layer formed thereon. The metal layer 17 can be Gold, Nickel, Palladium, Silver, Tin, Nickel-Palladium alloy, Chromium-Titanium alloy, Nickel-Gold alloy, Palladium-Gold alloy or Nickel-Palladium-Gold alloy. Via the conductivity of the conductive film 15, electric currents flow from the internal circuit 10 through the conductive via 11, and the conductive film 15 to the isolated pads 13, so as to form a metal layer on the outer surface of the isolated pad bodies 130 and part of the length of the plating lines 131 extending therefrom. With regard to the present embodiment of the invention, the metal layer 17 is preferably a Nickel-Gold double-layer with the Nickel layer formed prior to the Gold layer. Beside Nickel-Gold, the plated layer can be composed of one metal alone such as Nickel, Gold, or any one of the above-mentioned metals or alloys. Any substitution of metals, for example plating Palladium on the isolated pads, should be construed as conforming with the scope of the invention.

Figure 6A:
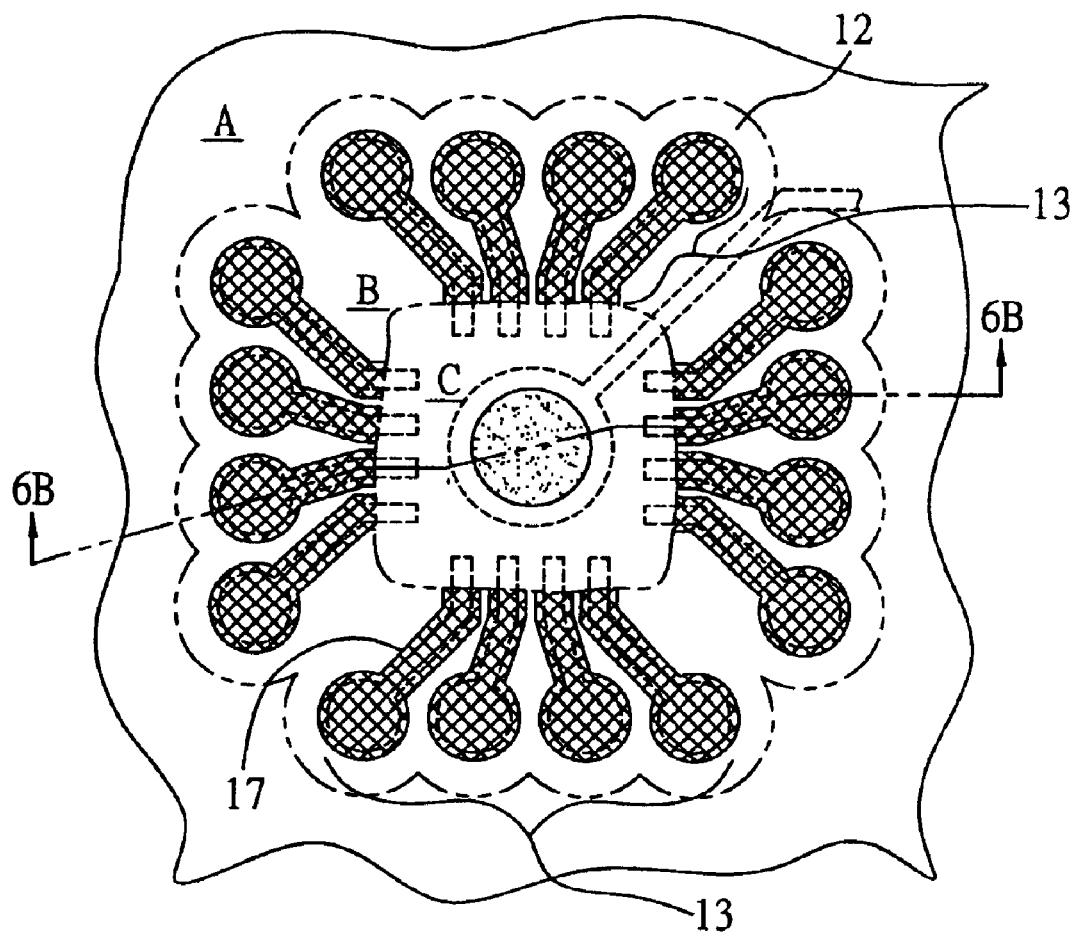
FIG. 6A is a schematic top-view showing the substrate at the stage after the photoresist layer and conductive film have been both removed, in accordance with the invention.
Figure 6B:
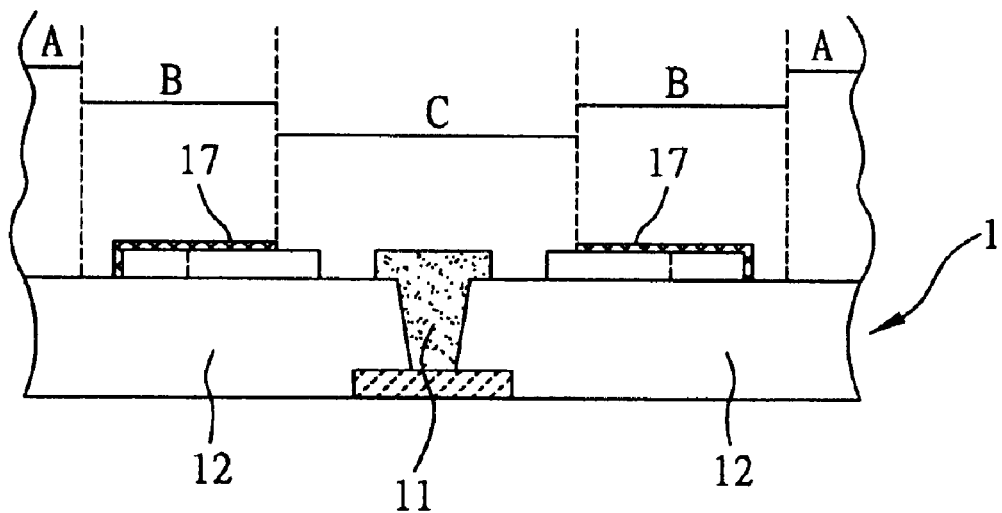
FIG. 6B is a schematic cross-sectional view showing the substrate at the stage after the photoresist layer and conductive film have been both removed, in accordance with the invention.

As shown in FIG. 6A and FIG. 6B, after the metal layer 17 is plated on the exposed surfaces of the isolated pads 13, the photoresist layer 16 is removed, and then the conductive film 15 formed formerly covered by the photoresist layer in peripheral pad region "A" and blind via plating region "C" so as to form the structure shown in FIG. 6A where a plurality of isolated pads 13 plated with metal layer 17 is formed on the dielectric layer 12.

Figure 7A:
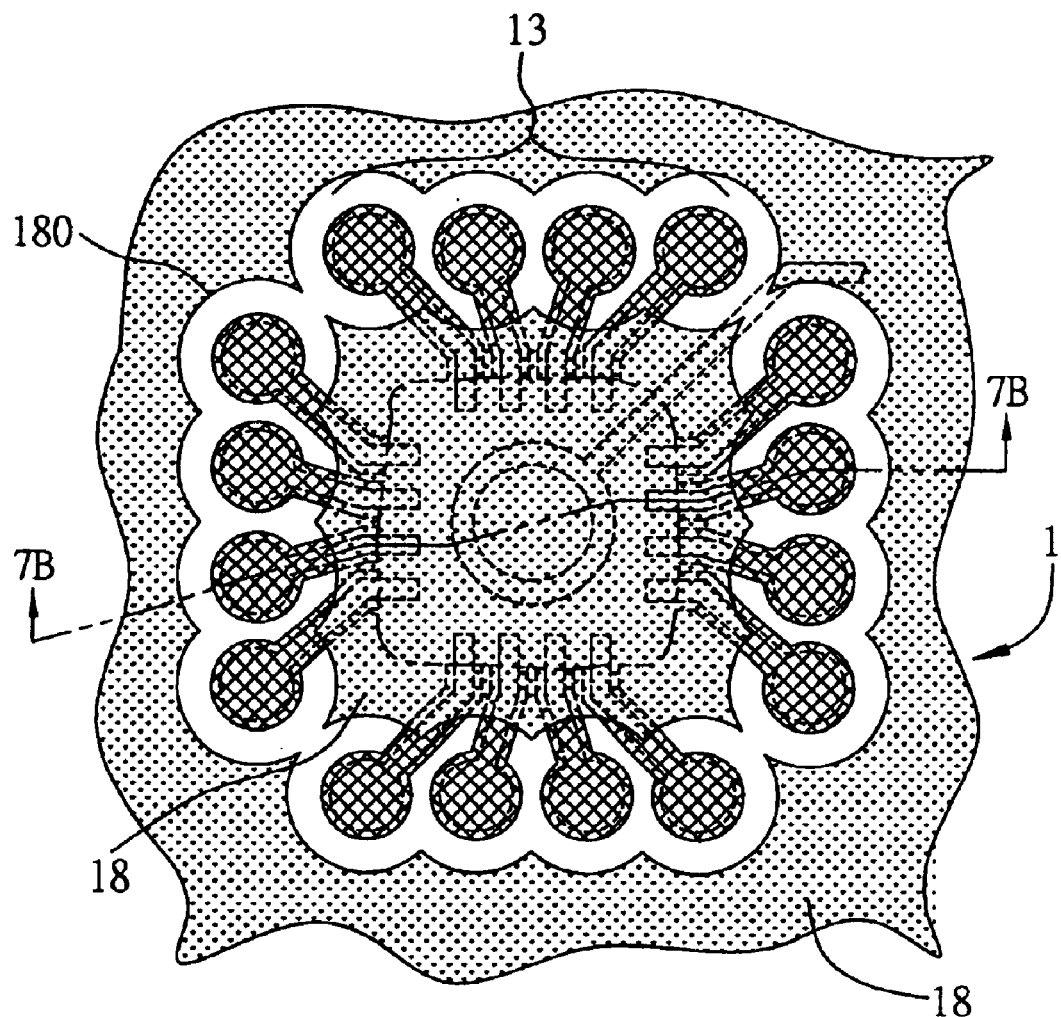
FIG. 7A is a schematic top-view showing the substrate at the stage after a solder mask has been applied over the substrate, in accordance with the invention.
Figure 7B:
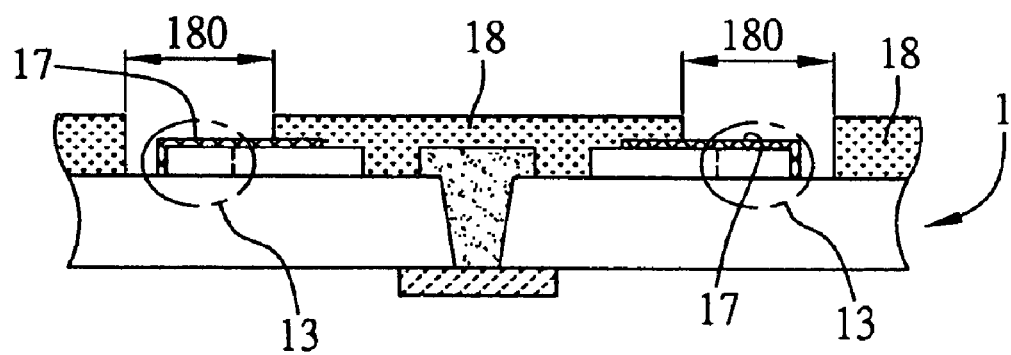
FIG. 7B is a schematic cross-sectional view showing the substrate at the stage after a solder mask has been applied over the substrate, in accordance with the invention.
Figure 8:
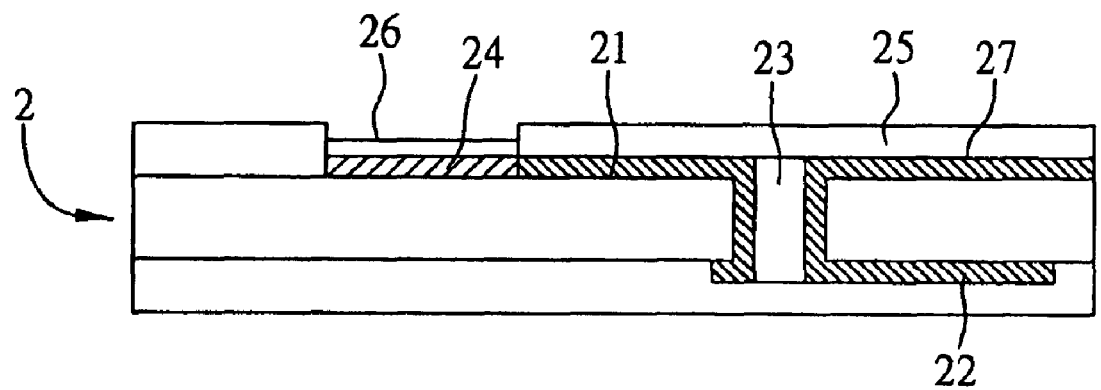
FIG. 8 (PRIOR ART) is a schematic top-view showing a conventional ball grid array (BGA) semiconductor package substrate using plating lines to plate the surface.
Figure 9A:
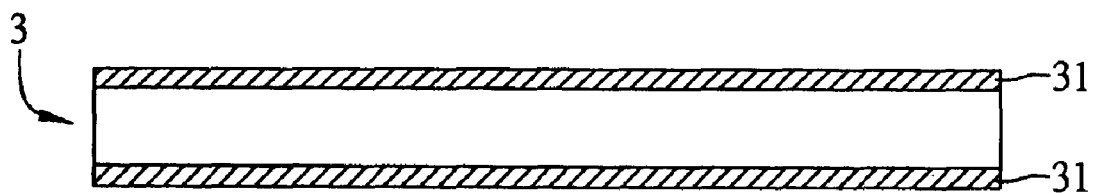
FIGS. 9A to 9D (PRIOR ART) are a series of schematic diagrams showing the steps of plating a substrate using the conventional gold pattern plating technology.
Figure 9B:
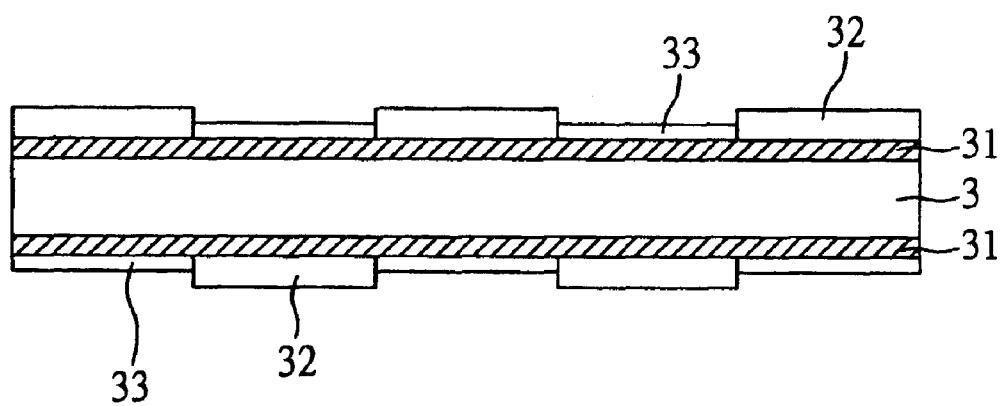
Figure 9C:
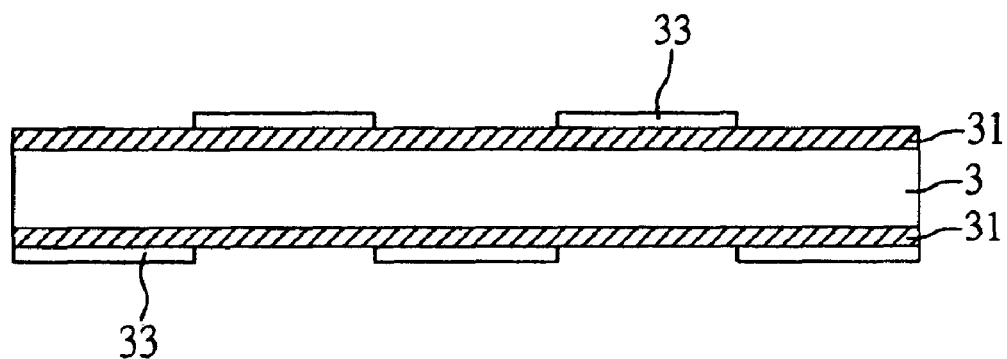
Figure 9D:
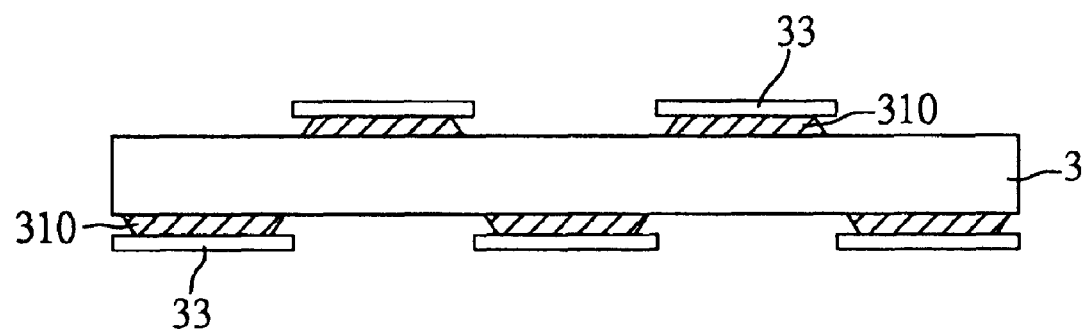
Figure 10:
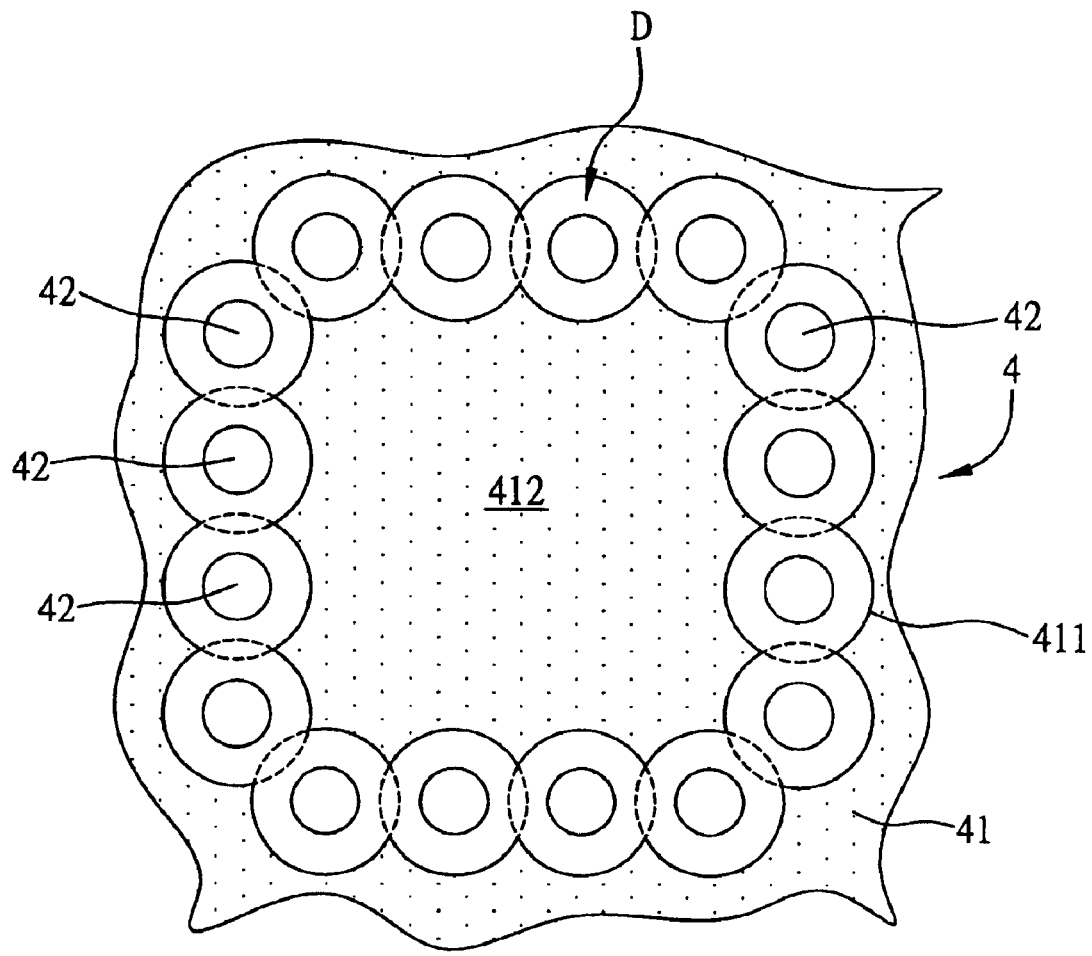
FIG. 10 (PRIOR ART) is a schematic top-view showing a substrate having overlapped isolated pads within a ring array area using the conventional non-plating line technology.

Lastly, as shown in FIG. 7a and FIG. 7B, a solder mask 18 (such as green paste) is applied over the surface of the substrate 1 for protecting the substrate 1 from contamination and preventing undesired electrical connections. The solder mask layer 18 is formed with at least one opening 180 allowing each isolated pad 13 plated with a metal layer 17 to be exposed through the solder mask layer 18. Each opening 180 of the solder mask layer 18 is variable in size depending on the size of the isolated pad 13 and is formed using either the solder mask defined (SMD) or the non-solder mask defined (NSMD) method. After this process is completed, the isolated pads 13 plated with a metal layer 17 can serve as an interconnection means for electrically connecting with the chips or printed circuit boards.

With the provision of a conductive blind via being surrounded by the isolated pads within a ring array area, it is possible to plate a metal layer on the surface of the isolated pads in a substrate with a high density of circuit layout such that more space can be provided around the periphery of the isolated pads for circuit layout.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of plating a metal layer over isolated pads arranged in a ring array on a semiconductor package substrate, comprising:

preparing a substrate having a plurality of conductive blind vias electrically connected with internal circuits thereof, and a plurality of isolated pads formed on a substrate thereof, wherein each of the isolated pads has a plating line that extends towards one of the conductive blind vias and is electrically insulated from the conductive blind via such that an electrically insulating region exists between terminals of the plating lines and the conductive blind vias;

applying a conductive film over the surface of the substrate, for electrically interconnecting the conductive blind vias and the plating lines;

applying a photoresist layer over the conductive film, wherein the photoresist layer is formed with at least one opening for exposing a portion of the conductive film covering the isolated pads;

removing the portion of the conductive film exposed through the opening of the photoresist layer, allowing the isolated pads to be electrically connected with the conductive blind vias by the conductive film;

electrifying the substrate to plate a metal layer on the isolated pads respectively; and removing the photoresist layer and the remainder of the conductive film covered by the photoresist layer, to restore the electrical insulation between the isolated pads and the conductive blind vias.

2. The method of claim 1, further comprising: applying a solder mask layer on the surface of the substrate, wherein the solder mask layer is formed with a plurality of openings for exposing the isolated pads respectively having the metal layer thereon.

3. The method of claim 2, wherein the solder mask layer is made of green paste.

4. The method of claim 2, wherein the opening of the solder mask layer is smaller than the isolated pad to form a solder mask defined (SMD) pad.

5. The method of claim 2, wherein the opening of the solder mask layer is larger than the isolated pad to form a non-solder mask defined (NSMD) pad.

6. The method of claim 1, wherein the conductive film is made of a material selected from the group consisting of metal, alloy, and conductive polymer.

7. The method of claim 6, wherein the conductive film is made of a material selected from the group consisting of copper, tin, nickel, chromium, titanium, copper-chromium alloy, and tin-lead alloy.

8. The method of claim 1, wherein the photoresist layer is made of a dry film or liquid photoresist.

9. The method of claim 1, wherein the metal layer is made of a material selected from the group consisting of gold, nickel, palladium, silver, tin, nickel-palladium alloy, chromium-titanium alloy, nickel-gold alloy, palladium-gold alloy, and nickel-palladium-gold alloy.

* * * * *